United States Patent [19]

Kondo et al.

[11] 4,309,485
[45] Jan. 5, 1982

[54] ENAMELED STEEL PLATE

[75] Inventors: Kazuo Kondo; Akio Takami, both of Nagoya, Japan

[73] Assignee: NGK Spark Plug Co., Ltd., Nagoya, Japan

[21] Appl. No.: 237,812

[22] Filed: Feb. 24, 1981

[51] Int. Cl.$^3$ .................... B32B 15/04; B32B 15/16; B05D 1/12; B05D 3/02
[52] U.S. Cl. .................................. 428/457; 427/180; 427/189; 427/193; 427/199; 428/471; 428/472
[58] Field of Search .................. 428/457, 471, 472; 427/180, 189, 193, 199

[56] References Cited

U.S. PATENT DOCUMENTS

| | | | |
|---|---|---|---|
| 4,005,232 | 1/1977 | Colebourne et al. | 428/472 |
| 4,052,526 | 10/1977 | Pratt et al. | 428/457 |
| 4,131,572 | 12/1978 | Brendley, Jr. | 428/457 |
| 4,221,824 | 9/1980 | Leonard et al. | 427/193 |
| 4,265,929 | 5/1981 | Wagner et al. | 427/193 |

FOREIGN PATENT DOCUMENTS

| | | | |
|---|---|---|---|
| 1541675 | 3/1979 | United Kingdom | 428/457 |
| 592802 | 2/1978 | U.S.S.R. | 428/472 |
| 654583 | 3/1979 | U.S.S.R. | 428/457 |

*Primary Examiner*—William J. Van Balen
*Attorney, Agent, or Firm*—Sughrue, Mion, Zinn, Macpeak & Seas

[57] ABSTRACT

An enameled steel plate is disclosed having a linear thermal coefficient of expansion at a temperature between 30° C. and 500° C. within the range of from $100 \times 10^{-7}$ to $190 \times 10^{-7}$/° C. and covered with phosphate glass or crystallized glass consisting essentially of from 40 to 75 mol % component X, from 20 to 55 mol % component Y, and from 0.1 to 10 mol % component Z, wherein Component X is $P_2O_5$;
Component Y is selected from ZnO, $K_2O$, $B_2O_3$ and $Al_2O_3$ in an amount of up to 20 mol % and CaO and BaO in an amount of up to 55 mol %; and
Component Z is selected from SrO, $Ta_2O_5$, $La_2O_3$, $CeO_2$, and $Nb_2O_5$.

The product has improved water resistance and chemical durability especially in high temperature and high humidity environment, and therefore, is suitable for use in thick film hybrid integrated circuits employed in automobiles.

7 Claims, No Drawings

ENAMELED STEEL PLATE

BACKGROUND OF THE INVENTION

The present invention relates to enameled steel plates having good insulating properties and water resistance and suitable for use in thick film hybrid integrated circuits.

Conventional thick film hybrid integrated circuits are typically formed on bases having an alumina content of at least 96% by weight (hereinafter referred to as alumina bases). Although alumina bases are good in heat resistance, chemical stability, mechanical strength, and compatibility with paste raw materials, they tend to be expensive, which is especially significant with respect to thick film hybrid integrated circuits. Therefore, less expensive raw materials have been under study for many years as alternatives to alumina bases, and various materials such as steatite, forsterite, glass, enamel, anodized aluminum, synthetic resins composed of organic materials, etc. have been investigated, but they had the disadvantages that there was no highly reliable printed circuit paste suitable for them and that the fundamental properties of the base materials are poorer than those of alumina.

On the other hand, whereas ceramics and glass, including alumina, have a disadvantage of being vulnerable to mechanical impact, enameled steel plates and anodized aluminum are strong against mechanical impact, low in cost, have a wider latitude in shape, and are good in heat dissipation. However, they have the significant drawback of poor electrical insulating properties.

In the early enameled steel plate, frits for enamels containing $Na_2O$ in an amount of 2 to 5 mol % were generally used, where a linear thermal coefficient of expansion of the frits was low as $6 \times 10^{-6}$ to $7.5 \times 10^{-6}/°C$. as compared with that of a steel plate of about $15 \times 10^{-6}/°C$., and the frits consequently had a disadvantage of poor adherence properties with the steel plate. And in order to improve the adherence property, increasing the content of $Na_2O$ caused the insulation to decrease.

Further, with the recent advance in automobile electronics, these hybrid integrated circuits have been increasingly used in automobiles, and in such cases, since they are typically used under environmental conditions of very high temperature and humidity (for example of a temperature of 60° C. and a relative humidity (RH) of 95%) in contrast with typical environmental conditions for electronic computers, conventional enameled steel plates have revealed a problem of being inadequate in water resistance under such high temperature and high humidity conditions. The reason for that is that $P_2O_5$ has a tendency to easily incorporate a great amount of hydroxyl group in the frit.

SUMMARY OF THE INVENTION

The present invention has been achieved in order to provide a material having improved properties under adverse environmental conditions. Thus, according to the invention there is provided an enameled steel plate having a linear thermal coefficient of expansion at a temperature between 30° C. and 500° C. of $100 \times 10^{-7}$ to $190 \times 10^{-7}/°C$. and covered with phosphate glass or crystallized glass composed of from 40 to 75 mol % component X, from 20 to 55 mol % component Y, and from 0.1 to 10 mol % component Z, wherein Component X is $P_2O_5$;
Component Y is selected from ZnO, $K_2O$, $B_2O_3$ and $Al_2O_3$ in an amount of up to 20 mol % and CaO and BaO in an amount of up to 55 mol %; and
Component Z is selected from SrO, $Ta_2O_5$, $La_2O_3$, $CeO_2$ and $Nb_2O_5$.

DETAILED DESCRIPTION OF THE INVENTION

This invention is based on the discovery that an enameled steel plate having good strength, good water resistance, and a linear thermal coefficient of expansion approximating that of ordinary steel plates can be obtained by crystallizing a glass having a composition as described above.

The linear thermal coefficient of expansion α refers to a change-rate of a length of sample with varying the temperature thereof under constant pressure. Provided that temperature is represented by T, the coefficient of expansion α upon the length which is represented by L can be defined as following equation:

$$\alpha = \frac{1}{L} \left( \frac{\delta L}{\delta T} \right)_p \approx \frac{1}{L} \frac{\Delta L}{\Delta T}$$

The glass transition temperature refers to such a temperature that a vitrified solid substance changes to a plastics-like substance, when the substance is heated.

Examples of steel plate that can be used according to this invention includes, SUS24, SUS27, SUS38, SUS42, SUS50, SUS51, SUS54, SUS57 and cold-rolled steel (the term "SUS" as herein refers to a "Steel Use Stainless").

In this invention component X, which is $P_2O_5$, is a principal component, forming a phosphate glass. Its content is limited to from 40 to 75 mol % because it is difficult to melt the frit if the content is less than 40 mol %, while if it exceeds 75 mol % the frit is unstable and lacks water resistance (therefore, when made into a water-quenched, it would be rapidly hydrated).

Component Y is combined with the acidic component X, $P_2O_5$, to neutralize its acidity and chemically stabilize it. Content of Component Y is limited to from 20 to 55 mol % because with less than 20 mol % the frit is unstable and significantly lacks water resistance and therefore, when made into a water-quenched frit, hydration rapidly takes place, while if the content is more than 55 mol %, the frit cannot be easily melted and exhibits a deterioration of properties.

Component Z has been found to have a function of combining with the sites in the $P_2O_5$ based glass which are liable to adsorb hydroxyl group, thus stabilizing its molecular structure, and enhancing water resistance and chemical durability. Its content is limited to from 0.1 to 10 mol % because with less than 0.1 mol % the desired effect of its addition is not achieved, whereas with a content of more than 10 mol % the adherence properties with the steel plate is poor, thereby making adhesion inadequate, and the water resistance deteriorates.

A method for the production of an enameled steel plate in accordance with the present invention will now be described.

As a source of the $P_2O_5$ which constitutes component X, there may be used ammonium secondary phosphate $(NH_4)_2HPO_4$, ammonium tertiary phosphate (NH$_4$)$_3$PO$_4$ and the like, in addition to using orthophosphoric acid H$_3$PO$_4$, and minerals of calcium phosphate such as 3CaO.P$_2$O$_5$, apatite series, etc. in case that CaO may be incorporated in the glass as a source for the oxides constituting component Y. As sources for the oxides constituting component Y, viz., ZnO, K$_2$O, B$_2$O$_3$, Al$_2$O$_3$, CaO and BaO, in addition to using these oxides directly, any of their carbonates, hydroxides, etc. which can be converted to the above-mentioned oxides on heating may be used; if desired, their sulfates such as potassium sulfate, calcium sulfate, etc., their chlorides such as potassium chloride, calcium chloride, etc., their acetates such as aluminum acetate, potassium acetate, calcium acetate, barium acetate, etc., their oxalates such as potassium oxalate, calcium oxalate, barium oxalate, etc., their nitrates such as potassium nitrate, calcium nitrate, aluminum nitrate, etc., their borates such as potassium borate, calcium borate, barium borate, etc., and their iodide may also be used; and further they can be used as compounds with phosphoric acid, that is, aluminum phosphate, potassium primary phosphate, potassium secondary phsphate, potassium tertiary phosphate, calcium primary phosphate, calcium secondary phosphate, calcium tertiary phosphate, barium secondary phosphate, etc., may be, for example, used.

As sources for oxides constituting component Z, viz., SrO, Ta$_2$O$_5$, La$_2$O$_3$, CeO$_2$ and Nb$_2$O$_5$, in addition to using these oxides directly, any of their carbonates, their hydroxides, their nitrates, their sulfates, etc. may be used.

These raw materials are ground and admixed and ground in a grinder mixer, such as a ball mill, crusher, etc., then melted in a crucible made of a refractory material, such as alumina, mullite, platinum, or the like, at from 1000° to 1200° C., and quenched in water, thereby vitrifying it, and finally it is finely ground with, for example, a conventional alumina ball mill. The particle size must be such that its average particle diameter is 10μ or less, and preferably 5μ or less. The steel plate to be used is degresed by a known method, e.g., by washing with chloroprene, etc. to remove oils, stains, etc. on the surface, and then rinsed with acid to remove oxides, after which the surface is roughened, e.g., by sandblasting, etc. The plate thus treated is then covered with the aforementioned frit powder by using conventional methods such as a sedimentation method, a screen printing method, a taping method, etc. as described, for example, in Japanese Patent Publication No. 23006/79; Glass Handbook, published by Asakura Shoten, p. 191; and Kenkyu Jitsuyo-ka Hokoku, Vol. 18, No. 2, p. 489 (1969), and after drying it is subjected to removal of resin at about 300° C. except that covered by the sedimentation method, and finally baked at from 700° to 900° C. for 15 to 60 minutes in oxygen containing gas. At that occasion, depending on the composition, some crystallization take place, which generally improves characteristics of the product.

The screen method described above is performed according to the following steps.

A frit grounded to an average particle diameter of 5μ; and 80 cc of acetone, 4 g of resin [that is, EC-45 (manufactured by Dow Chem. Co.); thermoplastic cellulose ester], and 30 cc of butyl carbitol each based on 100 g of said frit are put into an alumina pot and then they are admixed for 24 hours to obtain a paste. While acetone is eliminated from the resulting paste, viscosity of the paste is adjusted to 600 poise. After the steel plate is treated with chemical (i.e., degrease→washing with water→washing with acid→washing with water→nickel-processing→neutralizing→drying) to clean the surface thereof, the resulting paste is coated on said treated steel plate, by means of #150 mesh pattern according to glass paste printing method, wherein the raw thickness of the coating layer is about 70μ per one coating. The steel plate which is subject to glass paste printing is dried at a temperature of 70° to 80° C. for one hour, and then said coating is repeated over again (generally about 4 times) till the coating layer becomes at a fixed thickness. The raw product coated with said paste is eliminated the resin slowly at a temperature of 33° C. for one hour and then at a temperature of 300° C. for 4 hours. Thus product is baked under temperature conditions containing two steps, that is, it is kept at a temperature in the vicinity of melting point of the frit in order to improve the wettability and then it is baked at a temperature of more than a crystallized temperature (that is, 700° to 900° C.) for from 15 minutes to one hour.

The present invention will be more particularly described by the following Example.

EXAMPLE 1

As frits for enamels in accordance with the present invention, various components, i.e., H$_3$PO$_4$, BaCO$_3$, CaCO$_3$, MgCO$_3$, ZnO, H$_3$BO$_3$, Al$_2$O$_3$, SrO, Ta$_2$O$_5$, La$_2$O$_3$, CeO$_2$ and Nb$_2$O$_5$ were weighed and admixed so as to provide the respective compositions listed in Table 1, and each mixture obtained was melted in a platinum crucible at 1300° to 1400° C., and the molten product was quenched in water to obtain frits, respectively. The characteristic values of the frits obtained are listed in Table 1.

TABLE 1

| Frit | Component X (mol %) | Component Y (mol %) | | Component Z (mol %) | | Glass Transition Temperature (°C.) | Leaner Thermal Coefficient of Expansion (30 to 400° C.) (/°C.) | Crystallization Temperature (°C.) | Remarks |
|---|---|---|---|---|---|---|---|---|---|
| AR | P$_2$O$_5$ 47 | CaO | 44 | | 0 | 506 | 108 × 10$^{-7}$ | 666 | Comparative Frit |
| | | Al$_2$O$_3$ | 1 | | | | | | |
| | | BaO | 8 | | | | | | |
| B | " | CaO | 44 | SrO | 3 | 520 | 118 × 10$^{-7}$ | 690 | Invention |
| | | Al$_2$O$_3$ | 1 | | | | | | |
| | | BaO | 5 | | | | | | |
| C | " | BaO | 5 | Ta$_2$O$_5$ | 3 | 532 | 104 × 10$^{-7}$ | 700 | " |
| D | " | BaO | 5 | La$_2$O$_3$ | 3 | 530 | 116 × 10$^{-7}$ | 678 | " |
| E | " | BaO | 5 | CeO$_2$ | 3 | 524 | 110 × 10$^{-7}$ | 690 | " |
| F | " | BaO | 5 | Nb$_2$O$_5$ | 3 | 532 | 94 × 10$^{-7}$ | | " |
| G | " | BaO | 5 | SrO | 6 | 500 | 125 × 10$^{-7}$ | 650 | " |
| H | " | BaO | 5 | SrO | 8 | 470 | 140 × 10$^{-7}$ | 620 | " |
| IR | " | BaO | 5 | SrO | 15 | 450 | 160 × 10$^{-7}$ | 600 | Comparative Frit |

TABLE 1-continued

| Frit | Component X (mol %) | Component Y (mol %) | | Component Z (mol %) | | Glass Transition Temperature (°C.) | Leaner Thermal Coefficient of Expansion (30 to 400° C.) (/°C.) | Crystallization Temperature (°C.) | Remarks |
|---|---|---|---|---|---|---|---|---|---|
| J | $P_2O_5$ 46 | BaO | 44 | SrO | 3 | 500 | $150 \times 10^{-7}$ | 710 | Invention |
|   |   | $Al_2O_3$ | 2 |   |   |   |   |   |   |
|   |   | MgO | 5 |   |   |   |   |   |   |
| K | $P_2O_5$ 60 | CaO | 5 | SrO | 3 | 498 | $110 \times 10^{-7}$ | 715 | " |
|   |   | BaO | 10 |   |   |   |   |   |   |
|   |   | $Al_2O_3$ | 7 |   |   |   |   |   |   |
|   |   | ZnO | 5 |   |   |   |   |   |   |
|   |   | MgO | 5 |   |   |   |   |   |   |
|   |   | $K_2O$ | 5 |   |   |   |   |   |   |
| L | $P_2O_5$ 70 | CaO | 5 | SrO | 3 | 560 | $93 \times 10^{-7}$ | 760 | " |
|   |   | $Al_2O_3$ | 7 |   |   |   |   |   |   |
|   |   | MgO | 5 |   |   |   |   |   |   |
|   |   | $B_2O_3$ | 10 |   |   |   |   |   |   |
| M | $P_2O_5$ 60 | BaO | 20 | SrO | 3 | 543 | $105 \times 10^{-7}$ | 720 | " |
|   |   | ZnO | 17 |   |   |   |   |   |   |

Further, each of the above obtained frits was ground to an average particle diameter of 5μ, coated by a screen method onto a steel plate, the surface of which had been cleaned and roughened in a conventional manner, and then baked at 700° to 900° C. The obtained plates were left under high temperature and high humidity conditions of 60° C. and 95% relative humidity, and measured for the time to discoloration or exfoliation. The results are given in Table 2.

TABLE 2

| Sample No. | Steel Material | Frit | Time to Discoloration or Exfoliation (hrs) | Remarks |
|---|---|---|---|---|
| IR | SUS 24 | AR | 300 | Comparative |
| 2 | Cold-rolled Steel | B | 1000 or more | Invention |
| 3 | SUS 24 | C | 1000 or more | " |
| 4 | Cold-rolled Steel | D | 900 | " |
| 5 | SUS 38 | E | 800 | " |
| 6 | SUS 50 | F | 600 | " |
| 7 | Cold-rolled Steel | G | 1000 or more | " |
| 8 | SUS 42 | H | 1000 or more | " |
| 9R | Cold-rolled Steel | IR | 500 | Comparative |
| 10 | SUS 27 | J | 900 | Invention |
| 11 | SUS 51 | K | 800 | " |
| 12 | SUS 54 | L | 650 | " |
| 13 | SUS 57 | M | 700 | " |

As is evident from the Table 2, Sample No. 1R using Frit AR containing no component Z and Sample No. 9R using Frit IR in which the SrO content was higher than the range according to the present invention caused discoloration or exfoliation in 300 hours and 500 hours respectively when left in high temperature and high humidity environment, whereas the products according to the present invention were stable for 600 hours or longer and showed durability even when fitted under the hoods of automobiles.

While the invention has been described in detail and with reference to specific embodiment thereof, it will be apparent to one skilled in the art that various changes and modifications can be made therein without departing from the spirit and scope thereof.

What is claimed is:

1. An enameled steel plate having a linear thermal coefficient of expansion at a temperature between 30° C. and 500° C. within the range of from $100 \times 10^{-7}$ to $190 \times 10^{-7}$/°C. and covered with phosphate glass or crystallized glass consisting essentially of from 40 to 75 mol % component X, from 20 to 55 mol % component Y, and from 0.1 to 10 mol % component Z, wherein
   Component X is $P_2O_5$;
   Component Y is selected from ZnO, $K_2O$, $B_2O_3$ and $Al_2O_3$ in an amount of up to 20 mol %, and CaO and BaO in an amount of up to 55 mol %;
   Component Z is selected from SrO, $Ta_2O_5$, $La_2O_3$, $CeO_2$, and $Nb_2O_5$.

2. An enameled steel plate as in claim 1 wherein said component Z is selected from SrO, $Ta_2O_5$, $La_2O_3$, $CeO_2$, and $Nb_2O_5$ in an amount of from 1 to 8 mol %.

3. An enameled steel plate as in claim 1 or 2 wherein the steel plate is stainless steel or cold-rolled steel.

4. A process for producing enamel steel plate having a linear thermal coefficient of expansion at a temperature between 30° C. and 500° C. within the range of from $100 \times 10^{-7}$ to $190 \times 10^{-7}$/°C. and covered with phosphate glass or crystallized glass composed of from 40 to 75 mol % component X, from 20 to 55 mol % component Y, and from 0.1 to 10 mol % component Z, wherein
   Component X is $P_2O_5$;
   Component Y is selected from ZnO, $K_2O$, $B_2O_3$ and $Al_2O_3$ in an amount of up to 20 mol % and CaO and BaO in an amount of up to 55 mol %; and
   Component Z is selected from SrO, $Ta_2O_5$, $La_2O_3$, $CeO_2$, and $Nb_2O_5$,
which comprises grinding and admixing oxides or precursors of the oxides constituting components X, Y, and Z in a grinder, grinding the resulting mixture, melting said mixture in a crucible, quenching the melted mixture in water, vitrifying the melt, finely grinding the resulting vitreous substance to obtain a frit powder having an average particle diameter of 10μ or less, covering a steel plate with said frit powder, and baking the plate covered with said frit powder.

5. A process as in claim 4 wherein the average particle diameter is 5μ or less.

6. A process as in claim 4 or 5 wherein said Component Z is selected from SrO, $Ta_2O_5$, $La_2O_3$, $CeO_2$, and $Nb_2O_5$ in an amount of from 1 to 8 mol %.

7. A process as in claim 4 or 5 wherein the steel plate is stainless steel or cold-rolled steel.

* * * * *